(12) United States Patent
Yu et al.

(10) Patent No.: US 10,745,818 B2
(45) Date of Patent: Aug. 18, 2020

(54) METHOD OF FABRICATING PACKAGE SUBSTRATES

(71) Applicant: PHOENIX PIONEER TECHNOLOGY CO., LTD., Hsinchu County (TW)

(72) Inventors: Chun-Hsien Yu, Hsinchu County (TW); Shih-Ping Hsu, Hsinchu County (TW); Pao-Hung Chou, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 461 days.

(21) Appl. No.: 15/372,714

(22) Filed: Dec. 8, 2016

(65) Prior Publication Data

US 2017/0198406 A1 Jul. 13, 2017

(30) Foreign Application Priority Data

Jan. 8, 2016 (TW) .............................. 105100616 A (51) Int. Cl.
 *B05D 1/32* (2006.01)
 *B05D 1/36* (2006.01)
 (Continued)

(52) U.S. Cl.
 CPC .......... *C25D 5/022* (2013.01); *H01L 21/4857* (2013.01); *H01L 21/6835* (2013.01);
 (Continued)

(58) Field of Classification Search
 CPC .............. C23C 28/00; B05D 1/32; B05D 1/36
 (Continued)

(56) References Cited

U.S. PATENT DOCUMENTS

| | | | | |
|---|---|---|---|---|
| 5,627,406 A | * | 5/1997 | Pace | ..................... H01L 21/485 257/690 |
| 2006/0043568 A1 | * | 3/2006 | Abe | .................... H01L 21/4857 257/698 |

(Continued)

FOREIGN PATENT DOCUMENTS

| | | | | | |
|---|---|---|---|---|---|
| JP | 2008-263125 | * | 10/2008 | ............. | H01L 23/12 |
| JP | 2011-228605 | * | 11/2011 | ............... | H05K 3/26 |
| WO | WO-2016043748 A1 | * | 3/2016 | ....... | H01L 21/02381 |

*Primary Examiner* — Edna Wong
(74) *Attorney, Agent, or Firm* — Wpat, PC (57) ABSTRACT

This disclosure provides a package substrate fabrication method including: providing a carrier; forming a first dielectric layer on the carrier while enabling the first dielectric layer to be patterned including an opening; forming a first conducting unit on the carrier while enabling the first conducting unit to fill up the opening, a height of the first conducting unit at the opening larger than a thickness of the first dielectric layer, and a width of the first conducting unit larger than a width of the opening; forming a second dielectric layer on the first conducting unit; forming a second conducting unit on the second dielectric layer; forming a third dielectric layer on the second conducting unit; removing the carrier and the first dielectric layer while enabling the part of the first conducting unit in the opening to be removed; and forming a fourth dielectric layer to cover the first conducting unit.

5 Claims, 9 Drawing Sheets

(51) Int. Cl.
*C23C 28/00* (2006.01)
*C25D 5/02* (2006.01)
*H01L 21/48* (2006.01)
*H01L 21/683* (2006.01)
*H01L 23/498* (2006.01)
*C25D 7/00* (2006.01)

(52) U.S. Cl.
CPC .. *H01L 23/49822* (2013.01); *H01L 23/49827* (2013.01); *C25D 7/00* (2013.01); *H01L 21/486* (2013.01); *H01L 2221/68345* (2013.01)

(58) Field of Classification Search
USPC ......... 427/96.1, 96.2, 97.4, 97.5, 97.6, 98.5, 427/117, 118, 259; 205/118, 123, 125
See application file for complete search history.

(56) References Cited

U.S. PATENT DOCUMENTS

2007/0126108 A1* 6/2007 Yamazaki ......... H01L 23/49816
257/690
2008/0258300 A1* 10/2008 Kobayashi .......... H01L 21/4853
257/737

\* cited by examiner

METHOD OF FABRICATING PACKAGE SUBSTRATES

CROSS REFERENCE TO RELATED APPLICATION

This application claims the benefit of Taiwan application Serial No. 105100616, filed on Jan. 8, 2016, the disclosure of which is incorporated by reference herein in its entirety.

FIELD OF THE INVENTION

The present invention relates to a method for fabricating package substrates.

BACKGROUND OF THE INVENTION

As recent rapid trend in modern electronic devices is not only toward lighter and smaller devices, but also toward multi-function and high-performance devices, the integrated-circuit (IC) fabrication and technology has to evolve correspondingly toward a more high-density and miniature design so as to allow more electronic components to be received inside limited chip space. Consequently, the relating IC package substrate and the package technology are evolved accordingly to meet the trend.

To design a high-density circuitry layout in a package substrate, a fine-pitch process such as semi-additive process (SAP) is used to reduce the package lead pitch. However, line width and line pitch of the circuit wires formed by SAP have almost the same size from 15 µm to 20 µm. The SAP circuit wires may have their thickness limit of 20 µm at most. A thick circuit wire may have a large cross-sectional area and thus a small resistivity, to be applied to high power electronic products. However, it is comparatively difficult to thicken circuit wires in a fine-pitch circuitry design.

Therefore, it is in need of a new and advanced packaging solution.

SUMMARY OF THE INVENTION

According to one aspect of the present disclosure, a first embodiment provides a method for fabricating a package substrate which includes: providing a carrier; forming a first dielectric layer on the carrier while enabling the first dielectric layer to be patterned including an opening exposing the carrier; forming a first conducting unit on the carrier while enabling a part of the first conducting unit to fill up the opening, a height of the first conducting unit at the opening to be larger than a thickness of the first dielectric layer, and a width of the first conducting unit above the first dielectric layer to be larger than a width of the opening; forming a second dielectric layer on the first conducting unit; forming a second conducting unit on the second dielectric layer; forming a third dielectric layer on the second conducting unit; removing the carrier and the first dielectric layer while enabling the part of the first conducting unit in the opening to be removed; and forming a fourth dielectric layer while enabling the same to cover the first conducting unit.

According to one aspect of the present disclosure, a second embodiment provides a method for fabricating a package substrate which includes: providing a first carrier and a second carrier; forming a first dielectric layer on the first carrier while enabling the first dielectric layer to be patterned including a first opening exposing the first carrier; forming a second dielectric layer on the second carrier while enabling the second dielectric layer to be patterned including a second opening exposing the second carrier; forming a first conducting unit on the first carrier while enabling a part of the first conducting unit to fill up the first opening, a height of the first conducting unit at the first opening to be larger than a thickness of the first dielectric layer, and a width of the first conducting unit above the first dielectric layer to be larger than a width of the first opening; forming a second conducting unit on the second carrier while enabling a part of the second conducting unit to fill up the second opening, a height of the second conducting unit at the second opening to be larger than a thickness of the second dielectric layer, and a width of the second conducting unit above the second dielectric layer to be larger than a width of the second opening; forming a third dielectric layer between the first and second conducting units; removing the first carrier while enabling the first dielectric layer to be removed, and removing the second carrier while enabling the second dielectric layer to be removed; and forming a fourth dielectric layer while enabling the same to cover the first and second conducting units.

According to one aspect of the present disclosure, a third embodiment provides a method for fabricating a package substrate which includes: providing a first carrier and a second carrier; forming a first dielectric layer on the first carrier while enabling the first dielectric layer to be patterned including a first opening exposing the first carrier; forming a second dielectric layer on the second carrier while enabling the second dielectric layer to be patterned including a second opening exposing the second carrier; forming a first conducting unit on the first carrier while enabling a part of the first conducting unit to fill up the first opening, a height of the first conducting unit at the first opening to be larger than a thickness of the first dielectric layer, and a width of the first conducting unit above the first dielectric layer to be larger than a width of the first opening; forming a second conducting unit on the second carrier while enabling a part of the second conducting unit to fill up the second opening, a height of the second conducting unit at the second opening to be larger than a thickness of the second dielectric layer, and a width of the second conducting unit above the second dielectric layer to be larger than a width of the second opening; forming a third dielectric layer between the first and second conducting units; removing the first carrier while enabling the part of the first conducting unit in the first opening to be removed, and removing the second carrier while enabling the part of the second conducting unit in the second opening to be removed; and forming a fourth dielectric layer while enabling the same to cover the first and second conducting units.

According to one aspect of the present disclosure, a fourth embodiment provides a method for fabricating a package substrate which includes: providing a first carrier and a second carrier; forming a first dielectric layer on the first carrier while enabling the first dielectric layer to be patterned including a first opening exposing the first carrier; forming a second dielectric layer on the second carrier while enabling the second dielectric layer to be patterned including a second opening exposing the second carrier; forming a first conducting unit on the first carrier while enabling a part of the first conducting unit to fill up the first opening, a height of the first conducting unit at the first opening to be larger than a thickness of the first dielectric layer, and a width of the first conducting unit above the first dielectric layer to be larger than a width of the first opening; forming a second conducting unit on the second carrier while enabling a part of the second conducting unit to fill up the second opening, a height of the second conducting unit at the second opening to be larger than a thickness of the second dielectric layer, and a width of the second conducting unit above the second dielectric layer to be larger than a width of the second opening; forming a third dielectric layer on the first conducting unit, and forming a fourth dielectric layer on the second conducting unit; removing the second carrier while enabling the part of the second conducting unit in the second opening to be removed; joining the second conducting unit to the third dielectric layer; removing the first carrier while enabling the part of the first conducting unit in the first opening to be removed, and forming a fifth dielectric layer while enabling the same to cover the first conducting unit.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

In the following embodiments of the present disclosure, when an element is described to be disposed above/mounted on top of or below/under another element, it comprises either the element is directly or indirectly disposed above/below the other element, i.e. when indirectly, there can be some other element arranged between the two; and when directly, there is no other element disposed between the two. It is noted that the descriptions in the present disclosure relate to "above" or "below" are based upon the related diagrams provided, but are not limited thereby. Moreover, the terms "first", "second", and "third", and so on, are simply used for clearly identifying different elements of the same nature, but those elements are not restricted thereby and must be positioned or arranged accordingly. In addition, the size or thickness of each and every element provided in the following diagrams of the present disclosure is only schematic representation used for illustration and may not represent its actual size.

Figure 1:
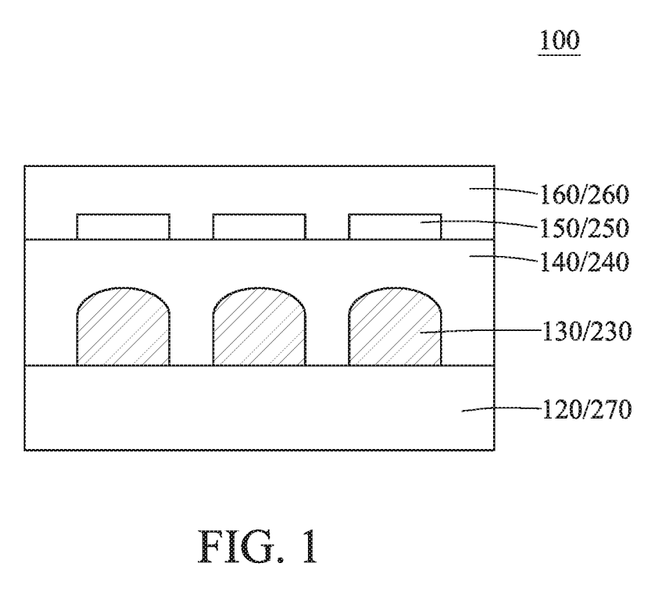
FIG. 1 is a cross-sectional view of a package substrate according to a first embodiment of the present disclosure.

FIG. 1 shows a cross-sectional view of a package substrate 100 according to a first embodiment of the present disclosure. The package substrate 100, with two circuitry layout layers, includes a lower dielectric layer 120, at least one lower conductive unit 130, a middle dielectric layer 140, at least one upper conductive unit 150, and an upper dielectric layer 160. Wherein, the middle dielectric layer 140 is configured for separating the lower conductive units 130 from the upper conductive units 150. The lower dielectric layer 120 supports the lower conductive unit 130 and the middle dielectric layer 140, and acts as a protective layer at the lowermost layer of the package substrate 100. The upper dielectric layer 160 covers the upper conductive unit 150 and the middle dielectric layer 140, and acts as another protective layer at the uppermost layer of the package substrate 100. The at least one upper conductive unit 150 represents the upper circuitry layout of the package substrate 100, and the at least one lower conductive unit 130 represents the lower circuitry layout of the package substrate 100. Three lower conductive units 130 and three upper conductive units 150 are demonstrated in the embodiment; but it is not limited thereto, the quantities of the lower conductive units 130 and the upper conductive units 150 may be different, and the locations of the lower conductive units 130 and the upper conductive units 150 may not overlap vertically. The conductive unit 130 or 150 can be one of the wires in the circuitry layout of the package substrate 100 formed by the conventional SAP process. As shown in FIG. 1, the upper conductive units 150 may have a thickness of less than 20 μm while the lower conductive units 130 may have a thickness of more than 20 μm. The lower conductive unit 130 has a larger cross-sectional area and thus has a small resistivity than the upper conductive unit 150. The main purpose of the present invention is about how to form thick wires (e.g. the ones with a thickness more than 20 μm) in the package substrate.

The fabrication process will be described in detail in the following paragraphs. Wherein, FIGS. 2A-2H and FIG. 1 are cross-sectional views of the package substrate 100 according to the first embodiment in the present disclosure, corresponding to different process steps.

Figure 2A:
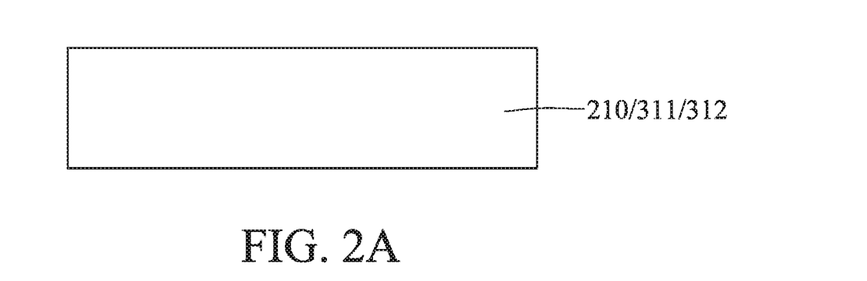
FIG. 2A-2H are cross-sectional views of the package substrate according to the first embodiment in the present disclosure, corresponding to different process steps.

As shown in FIG. 2A, a carrier 210 is provided to carry and support electronic components and conductive wires of the package substrate 100. The carrier 210 can be a metal substrate plate or a dielectric substrate plate coated with a metal layer, in which the metal can be Fe, Cu, Ni, Sn, Al, Ni/Au or their combination.

Figure 2B:
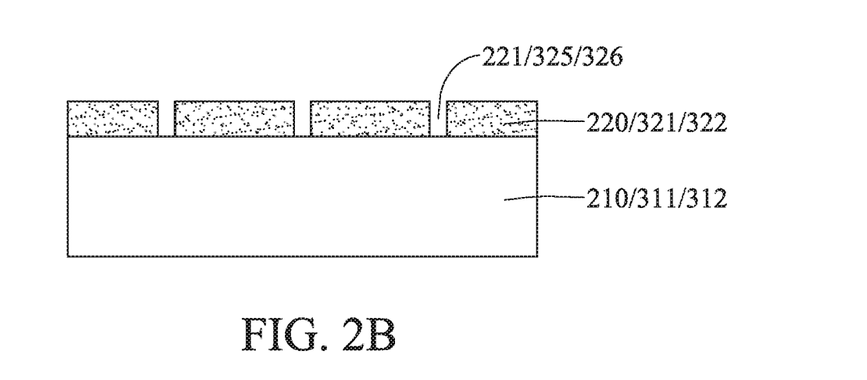

Next, a first dielectric layer 220 is formed on the carrier 210 while enabling the first dielectric layer 220 to be patterned including openings 221 exposing the carrier 210, as shown in FIG. 2B. Here, the first dielectric layer 220 can first be deposited on the carrier 210 and then patterned so that the openings 221 are formed in the first dielectric layer 220. The carrier 210 is covered by the first dielectric layer 220 except the places where the openings 221 are located. The openings 221 can be used to define the locations where the lower conductive unit 130 is to be formed. The first dielectric layer 220 may be made of photo-sensitive or non-photo-sensitive dielectric material. For example, if the first dielectric layer 220 is made of photoresist or photo-sensitive polyimide, the openings 221 can be formed by using a photolithography process. Or, if the first dielectric layer 220 is made of non-photo-sensitive polyimide, the openings 221 can be formed by using a laser engraving process.

Figure 2C:
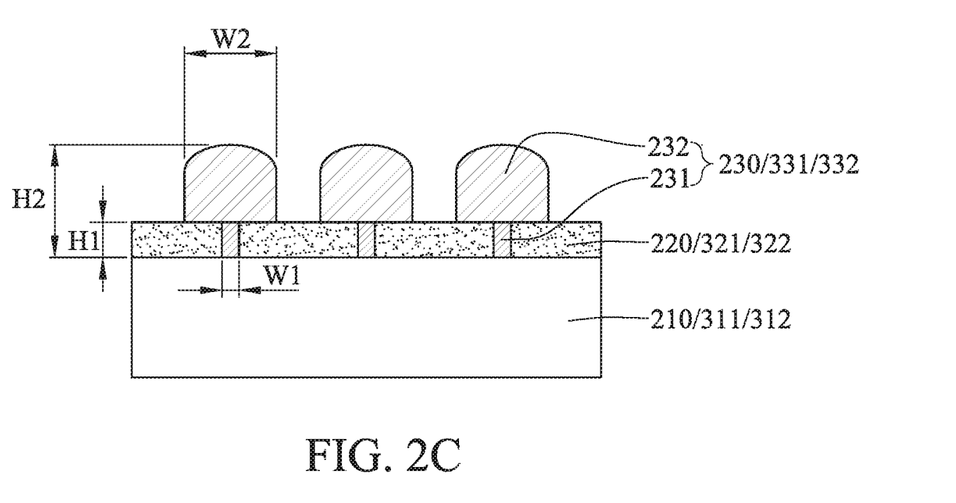

Next, a first conducting unit 230 is formed on the carrier 210 while enabling the first conducting unit 230 to include a first part 231 filling up the openings 221 and a second part 232 above the first dielectric layer 220, as shown in FIG. 2C. The total height (H2) of the first conducting unit 230 is larger than the thickness (H1) of the first dielectric layer 220, and the width (W2) of the second part 232 is larger than the width (W1) of the first part 231 in the first conducting unit 230. In the embodiment, the first conducting unit 230 may be made of metal such as Cu, Ni, Sn, Ni/Au or their combination by using an electrolytic plating or evaporating process. In an electrolytic plating process, the first dielectric layer 220 is used to prevent metal from being deposited on the carrier 210, and the metal can accumulate in and on the openings 221 to form the first conducting unit 230. Thus the first dielectric layer 220 can be called as a "plating-preventive" layer. H2 represents the total height of the first conducting unit 230 and W2 represents the width of the second part 232 of the first conducting unit 230. In the embodiment, the total height of the first conducting unit 230 is larger than the thickness of the first dielectric layer 220, and the cross-sectional area of the second part 232 is larger than that of the first part 231 in the first conducting unit 230.

Appropriate electrolytic plating conditions can be set to obtain the first conducting unit 230 as shown in FIG. 2C. At first, the metal accumulates on the carrier 210 and in the openings 221 to form the first part 231 of the first conducting unit 230. After the first part 231 is formed, the metal continue accumulating on the first part 231 and the metal layer expands upwards and outwards on the first dielectric layer 220 (as a "plating-preventive" layer) to be the second part 232 of the first conducting unit 230 if the electrolytic plating process is not interrupted. The first conducting unit 230 acts as the wires in the circuitry layout of the package substrate 100, and its linewidth W2 is dependent not only on the opening width W1 of the first dielectric layer 220 but also on the electrolytic plating conditions of the first conducting unit 230.

Figure 2D:
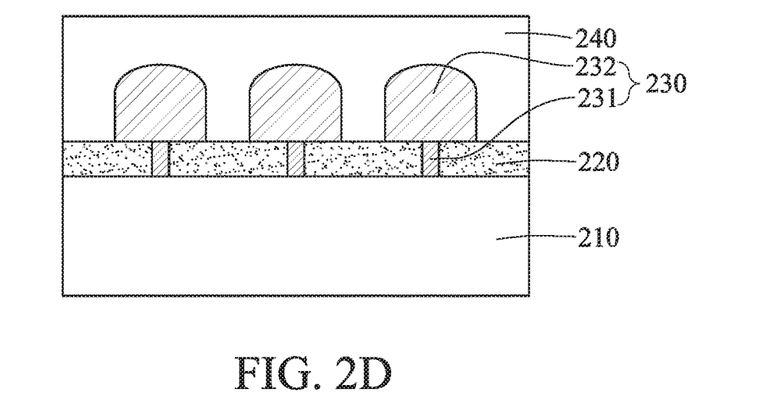

Next, a second dielectric layer 240 is formed on the first conducting unit 230 as shown in FIG. 2D. The second dielectric layer 240 may be made of photo-sensitive or non-photo-sensitive dielectric material.

Figure 2E:
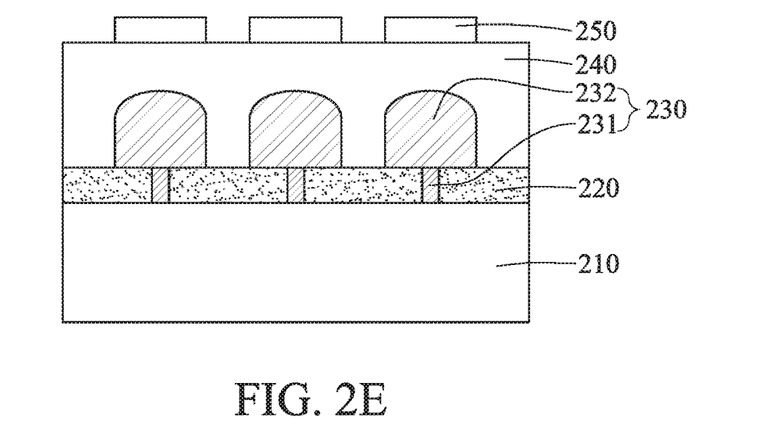

Next, a second conducting unit 250 can be formed on the second dielectric layer 240 by using the conventional SAP process as shown in FIG. 2E. The second conducting unit 250 acts as the wires in the circuitry layout of the package substrate 100, also. The second conducting unit 250 may be made of metal such as Cu, Ni, Sn, Ni/Au or their combination.

Figure 2F:
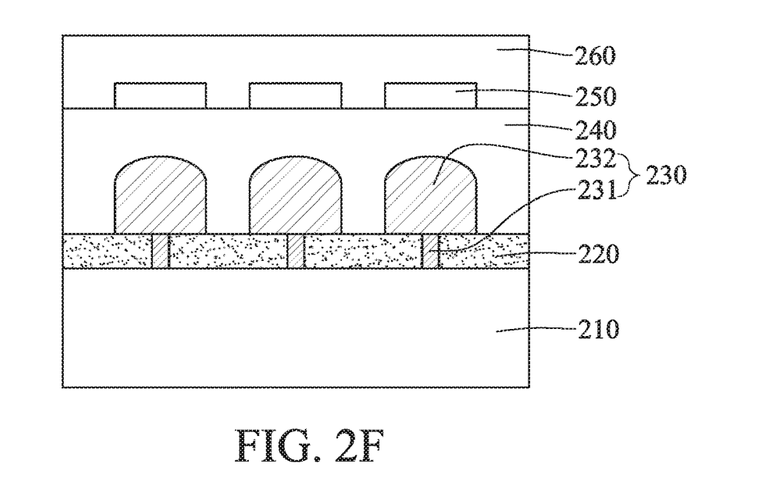

Next, a third dielectric layer 260 is formed on the second conducting unit 250 as shown in FIG. 2F. The third dielectric layer 260 covers the second conducting unit 250 and the second dielectric layer 240 and acts as a protective layer at the outermost layer of the package substrate 100 to protect the package substrate 100 from any adverse affect of its surrounding environment or posterior processes such as soldering.

Figure 2G:
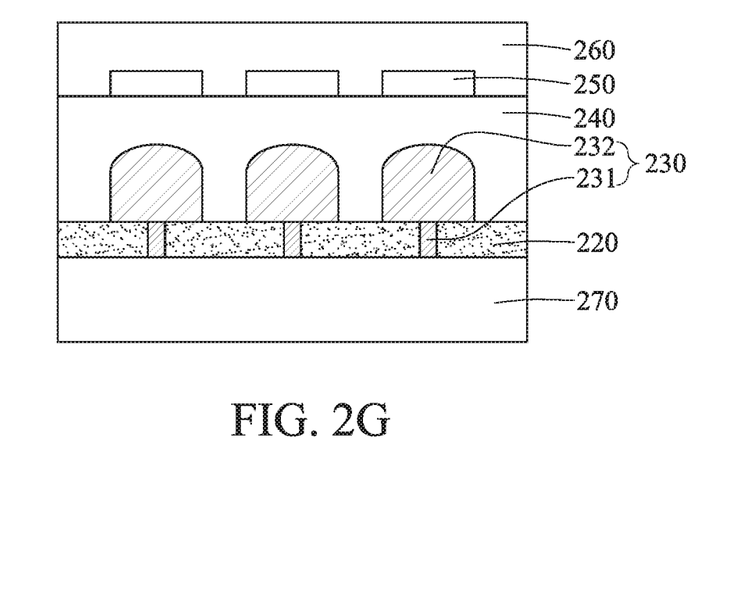

So far a package substrate with two conducting units 230 and 250 is obtained. The carrier 210 now can be removed to expose the bottom surface of the first conducting unit 230. Then a fourth dielectric layer 270 is formed below the exposed bottom surface of the first conducting unit 230 as shown in FIG. 2G, to be another protective layer at the lowermost layer of the package substrate 100 to protect the package substrate 100 from any adverse affect of its surrounding environment or posterior processes. The composition material of the fourth dielectric layer 270 may be the same or different from that of the third dielectric layer 260.

Figure 2H:
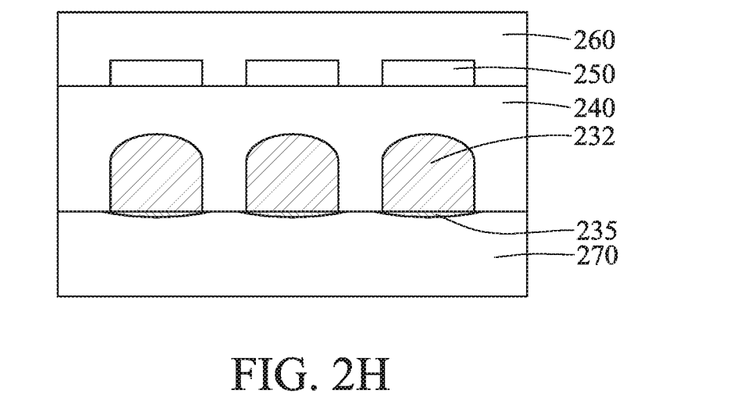

In addition, the first part 231 of the first conducting unit 230 in the openings 221 can also be removed after the removal of the carrier 210. By using the polishing process as an example, the first part 231 can be rubbed away, together with the removal of the first dielectric layer 220, and the process may stop at the bottom surface of the second part 232. In this embodiment, the fourth dielectric layer 270 is deposited below the exposed bottom surface of the second part 232 to cover the first conducting unit 230 and the second dielectric layer 240, as shown in FIG. 1. That is to say, the lower dielectric layer 120, the lower conductive unit 130, the middle dielectric layer 140, the upper conductive unit 150 and the upper dielectric layer 160 respectively correspond to the fourth dielectric layer 270, the first conducting unit 230, the second dielectric layer 240, the second conducting unit 250 and the third dielectric layer 260 of the package substrate 100 in the embodiment. In addition, before the formation of the fourth dielectric layer 270, a third conducting unit 235 can be formed below the second part 232 of the first conducting unit 230 as shown in FIG. 2H. The first conducting unit 230 and the third conducting unit 235 combine to form thicker wires, so as to reduce the resistivity of the wires. In the embodiments, the package substrate 100 may have wires formed by stacking two, three or more layers of conductive units, so that the wires may have a larger cross-section and thus a smaller resistivity.

FIGS. 2A-2C and FIG. 3A-3C are cross-sectional views of the package substrate 200 according to a second embodiment in the present disclosure, corresponding to different process steps.

At first, carriers 311 and 312 are provided as shown in FIG. 2A, each of which is basically the same as the carrier 210 in the first embodiment and not recited redundantly here.

Next, a first dielectric layer 321 is formed on the carrier 311 while enabling the first dielectric layer 321 to be patterned including first openings 325 exposing the carrier 311, as shown in FIG. 2B. Also, a second dielectric layer 322 is formed on the carrier 312 while enabling the second dielectric layer 322 to be patterned including second openings 326 exposing the carrier 312, as shown in FIG. 2B. Here, each of the first dielectric layer 321 and the second dielectric layer 322 is basically the same as the first dielectric layer 220 in the first embodiment and not recited redundantly here, and each of the first opening 325 and the second opening 326 is basically the same as the opening 221 in the first embodiment and not recited redundantly here.

Next, first conducting units 331 are formed on the carrier 311 while enabling each of the first conducting units 331 to include a first part filling up the first opening 325 and a second part above the first dielectric layer 331, as shown in FIG. 2C. The total height (H2) of the first conducting unit 331 is larger than the thickness (H1) of the first dielectric layer 321, and the width (W2) of the second part is larger than the width (W1) of the first part in the first conducting unit 331. Also, second conducting units 332 are formed on the carrier 312 while enabling each of the second conducting units 332 to include a first part filling up the second openings 326 and a second part above the second dielectric layer 322, as shown in FIG. 2C. The total height (H2) of the second conducting unit 332 is larger than the thickness (H1) of the second dielectric layer 322, and the width (W2) of the second part is larger than the width (W1) of the first part in the second conducting unit 332. Each of the first conducting unit 331 and the second conducting unit 332 is basically the same as the first conducting unit 331 in the first embodiment and not recited redundantly here. Three first conducting units 331 and three second conducting unit 332 are demonstrated in the embodiment; but it is not limited thereto, the quantities of the first conducting units 331 and the second conducting units 332 may be different.

Figure 3A:
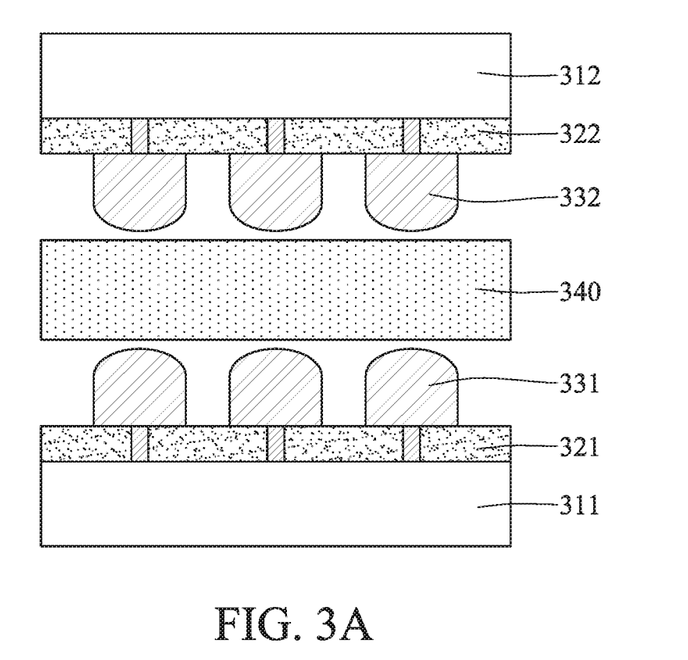
FIG. 3A-3C are cross-sectional views of the package substrate according to a second embodiment in the present disclosure, corresponding to different process steps.
Figure 3B:
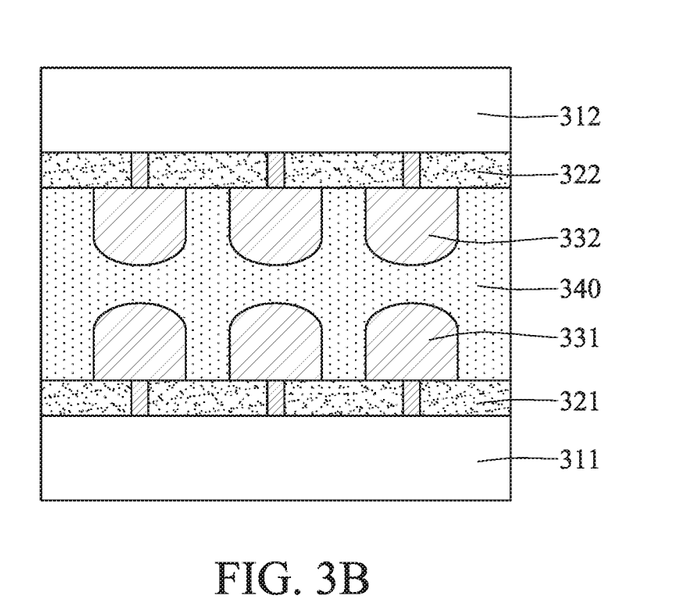

Next, a third dielectric layer 340 is to be formed between the first conducting units 331 and the second conducting units 332. Here, the third dielectric layer 340 can first be interposed between the carriers 311 and 312 as shown in FIG. 3A, and then the carriers 311 and 312 are pressed towards the third dielectric layer 340 to form the package structure as shown in FIG. 3B. By using a vacuum molding process as an example, the carrier 311, the first conducting unit 331, the third dielectric layer 340, the second conducting unit 332 and the carrier 312 can be pressed together to be the package structure. The third dielectric layer 340 may be made of flexible dielectric material with good flexibility and adhesion, so that it can be used in the vacuum molding process.

Figure 3C:
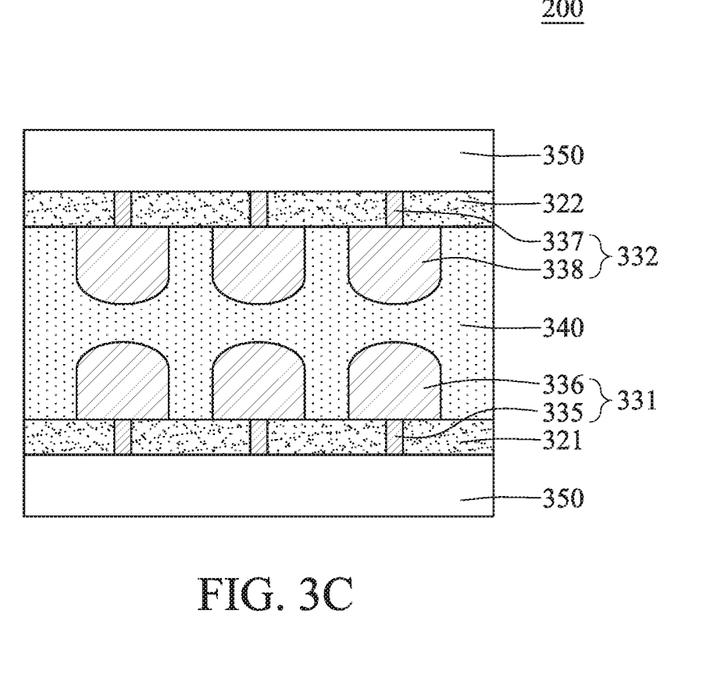

So far a package structure with two conducting units 331 and 332 is obtained. The carriers 311 and 312 now can be removed, and a fourth dielectric layer 350 is then formed on the second dielectric layer 322 and below the first dielectric layer 321 as shown in FIG. 3C. The fourth dielectric layers 350, covering the first conducting units 331 and the second conducting units 332, can be used as protective layers at the outermost layers to protect the package substrate 200 from any adverse affect of its surrounding environment or posterior processes.

The composition material of the fourth dielectric layer 350 may be the same or different from that of the first dielectric layer 321 and/or the second dielectric layer 322. In another embodiment, the first dielectric layer 321 can be removed after the removal of the carrier 311, while the second dielectric layer 322 can also be removed after the removal of the carrier 312. For such a package substrate, the occupation of the first dielectric layer 321 and the second dielectric layer 322 in the package substrate 200 of FIG. 3C will be replaced by the fourth dielectric layer 350.

Figure 4A:
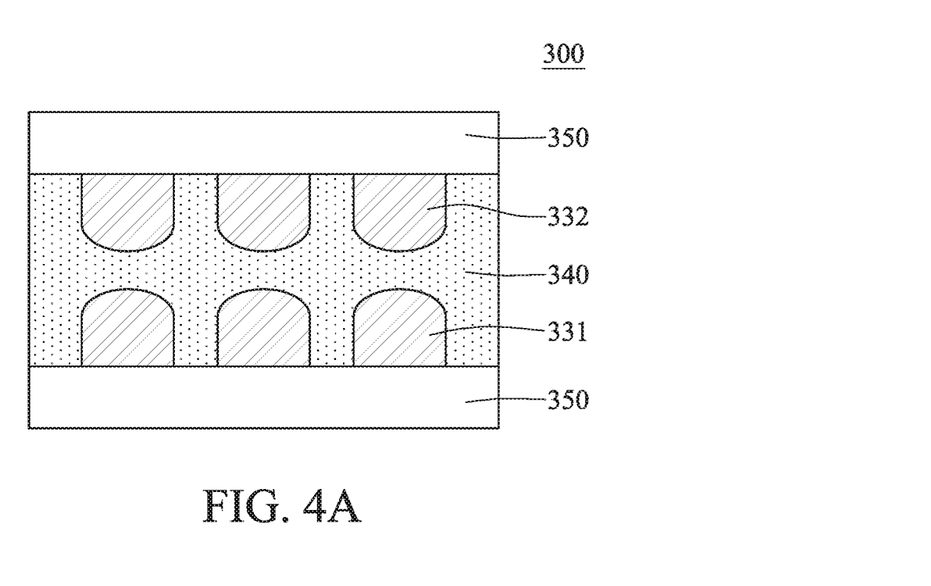
FIGS. 4A and 4B shows a cross-sectional view of a package substrate according to a third embodiment of the present disclosure.

FIG. 4A shows a cross-sectional view of a package substrate 300 according to a third embodiment of the present disclosure. The fabrication process is identical to that in the second embodiment in the steps of FIGS. 2A-2C and FIGS. 3A-3B, which are not recited redundantly here. In this embodiment, the first part 335 of the first conducting unit 331 in the first openings 325 is removed together with the removal of the first dielectric layer 321, while the first part 337 of the second conducting unit 332 in the second openings 326 is also removed together with the removal of the second dielectric layer 322, after the removal of the carriers 311 and 312. Thus, only the second part 336 remains as the first conducting unit 331, and only the second part 338 remains as the second conducting unit 332. By using the polishing process as an example, the first part 235 can be rubbed away, together with the removal of the first dielectric layer 321, and the first part 237 can be rubbed away, together with the removal of the second dielectric layer 322. Then, the fourth dielectric layer 350 is then formed on the second dielectric layer 322 and below the first dielectric layer 321 to cover the first conducting units 331, the third dielectric layer 340 and the second conducting units 332, to be the package substrate 300 as shown in FIG. 4A.

Figure 4B:
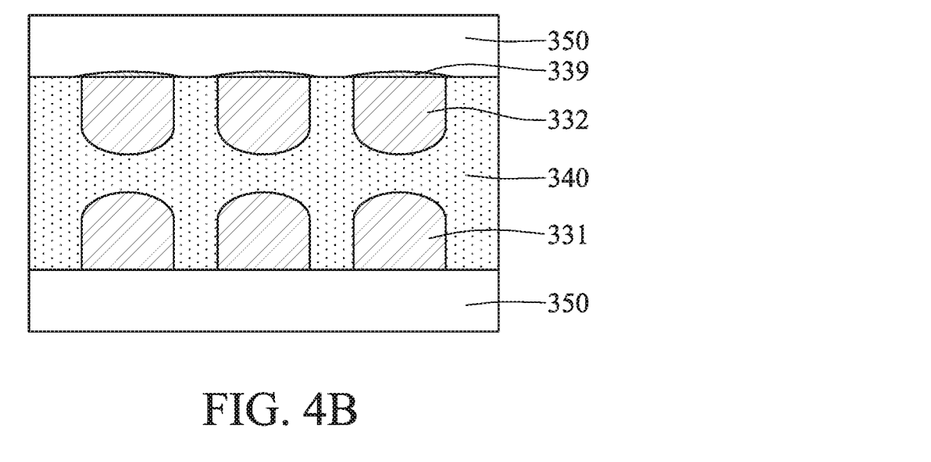

In another embodiment, before the formation of the fourth dielectric layer 350, a third conducting unit 339 can be formed on the second conducting unit 332 as shown in FIG. 4B. The second conducting unit 332 and the third conducting unit 339 combine to form thicker wires, so as to reduce the resistivity of the wires.

Figure 5A:
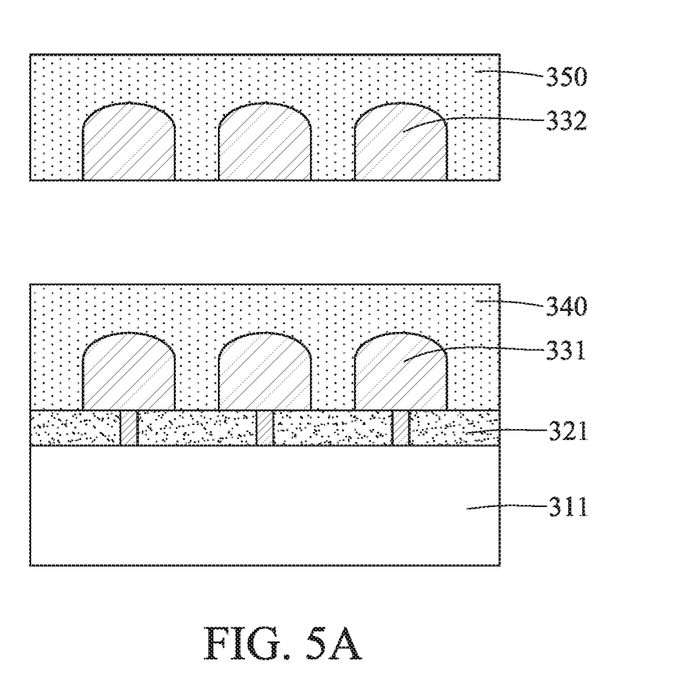
FIG. 5A-5D are cross-sectional views of the package substrate according to a fourth embodiment in the present disclosure, corresponding to different process steps.
Figure 5B:
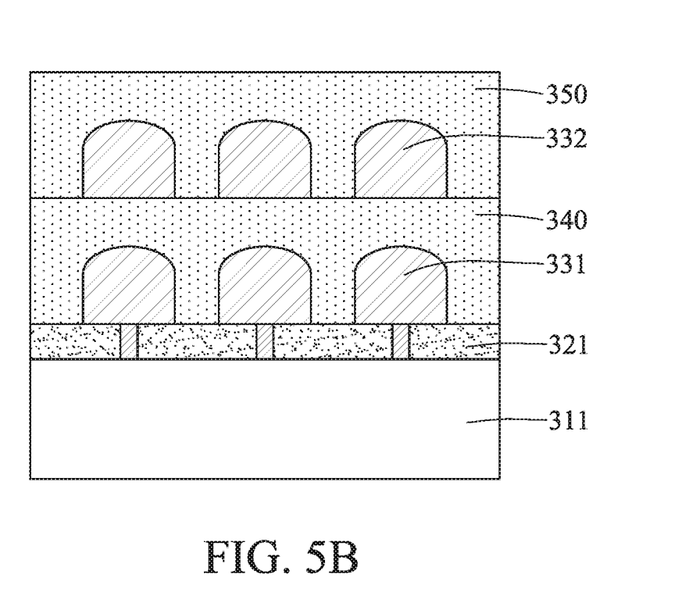
Figure 5C:
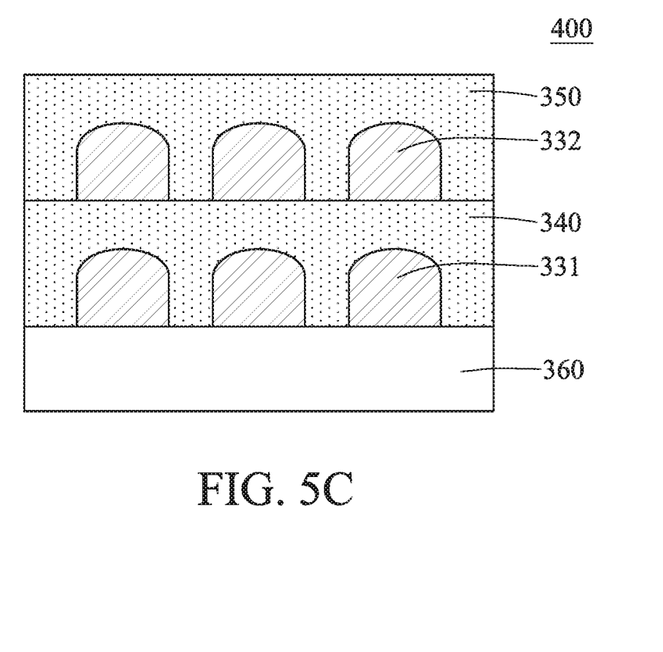

FIG. 5C shows a cross-sectional view of a package substrate 400 according to a fourth embodiment of the present disclosure. The fabrication process is identical to that in the second embodiment in the steps of FIG. 2A-2C, which are not recited redundantly here. In this embodiment, a third dielectric layer 340 is formed on the first conducting unit 331, and a fourth dielectric layer 350 is formed on the second conducting unit 332. The third dielectric layer 340 may be made of flexible dielectric material with good flexibility and adhesion, so that it can be used in the vacuum molding process. Then, the first part 337 of the second conducting unit 332 is removed together with the removal of the second dielectric layer 322, after the removal of the carriers 312. Thus, only the second part 338 remains as the second conducting unit 332. By using the polishing process as an example, the first part 337 can be rubbed away, together with the removal of the second dielectric layer 322. The fourth dielectric layer 350 is then formed on the second conducting unit 332 as shown in FIG. 5A, to protect the package substrate 400 from any adverse affect of its surrounding environment or posterior processes.

Next, the second conducting unit 332 and the fourth dielectric layer 350 are bonded to the third dielectric layer 340. Here, the second conducting unit 332 and the fourth dielectric layer 350 can be disposed on the third dielectric layer 340, and then the carrier 311 and the fourth dielectric layer 350 are pressed towards the third dielectric layer 340 to form the package structure as shown in FIG. 5B. By using a vacuum molding process as an example, the carrier 311, the first conducting unit 331, the third dielectric layer 340, the second conducting unit 332 and the fourth dielectric layer 350 can be pressed together to be the package structure.

So far a package structure with two conducting units 331 and 332 is obtained. Then the carrier 311, the first dielectric layer 321, and the first part 335 of the first conducting unit 331 can be removed, and only the second part 336 remains as the first conducting unit 331. By using the polishing process as an example, the first part 335 can be rubbed away, together with the removal of the first dielectric layer 321. The fifth dielectric layer 360 is then formed below the first conducting unit 331 as shown in FIG. 5C, to protect the package substrate 400 from any adverse affect of its surrounding environment or posterior processes. The composition material of the fifth dielectric layer 360 may be the same or different from that of the fourth dielectric layer 350.

Figure 5D:
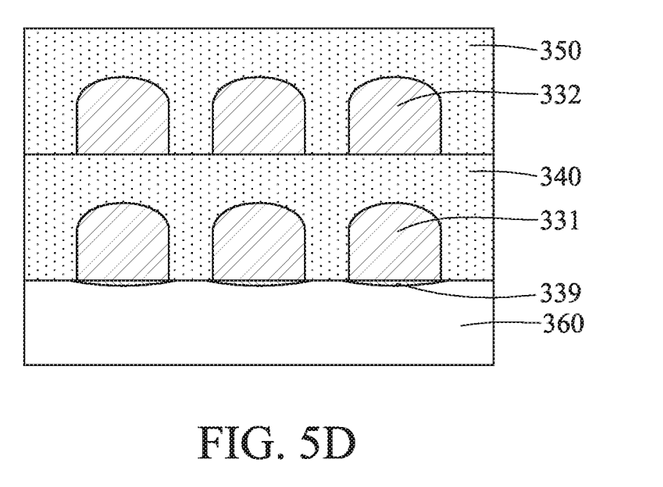

In another embodiment, before the formation of the fifth dielectric layer 360, a third conducting unit 339 can be formed below the first conducting unit 331 as shown in FIG. 5D. The first conducting unit 331 and the third conducting unit 339 combine to form thicker wires, so as to reduce the resistivity of the wires.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A method for fabricating a package substrate, comprising steps of:

providing a carrier;

forming a first dielectric layer on the carrier with a pattern as an opening exposing the carrier, wherein the opening is formed by using a photolithography process when the first dielectric layer is made of photoresist or photo-sensitive polyimide, and the opening is formed by using a laser engraving process when the first dielectric layer is made of non-photo-sensitive polyimide;

forming a first conducting unit on the carrier, wherein the first conducting unit comprising a first part and a second part, the first part fills up the opening, the second part is disposed on the first part and the first dielectric layer, and a width of the second part is larger than a width of the first part, the first conducting unit is a circuitry wire of the package substrate, and the first conducting unit is not a columnar conducting structure;

forming a second dielectric layer on the first conducting unit;

forming a second conducting unit on the second dielectric layer, wherein a cross section of the first conducting unit is larger than a cross section of the second conducting unit;

forming a third dielectric layer on the second conducting unit;

removing the carrier to expose a bottom of the first conducting unit; and forming a fourth dielectric layer for covering the bottom of the first conducting unit.

2. The method of claim 1, wherein the first conductive unit is formed by electrolytic plating.

3. The method of claim 1, wherein step of forming the fourth dielectric layer further comprises:

forming a third conducting unit on the bottom of the first conducting unit, and then forming the fourth dielectric layer for covering the first conducting unit and the third conducting unit.

4. The method of claim 1, wherein step of forming the fourth dielectric layer further comprises:

removing both the first dielectric layer and the first part of the first conducting unit in the opening, and then forming the fourth dielectric layer for covering the bottom of the first conducting unit.

5. The method of claim 4, wherein step of forming the fourth dielectric layer further comprises:

forming a third conducting unit on the bottom of the first conducting unit, and then forming the fourth dielectric layer for covering the bottom of the first conducting unit and the third conducting unit.

* * * * *